(12) United States Patent
Moschiano et al.

(10) Patent No.: US 8,243,521 B2
(45) Date of Patent: Aug. 14, 2012

(54) METHOD FOR KINK COMPENSATION IN A MEMORY

(75) Inventors: Violante Moschiano, Bacoli (IT); Frankie Roohparvar, Monte Sereno, CA (US); Giovanni Santin, Rieti (IT); Vishal Sarin, Cupertino, CA (US); Allahyar Vahidimowlavi, San Jose, CA (US); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 275 days.

(21) Appl. No.: 12/631,606

(22) Filed: Dec. 4, 2009

(65) Prior Publication Data

US 2011/0134701 A1    Jun. 9, 2011

(51) Int. Cl.
*G11C 16/04* (2006.01)
(52) U.S. Cl. ......... 365/185.19; 365/185.17; 365/185.18; 365/185.02
(58) Field of Classification Search ............. 365/185.19, 365/185.17, 185.18, 185.02
See application file for complete search history.

(56) References Cited

U.S. PATENT DOCUMENTS

| | | | |
|---|---|---|---|
| 6,956,770 B2 | 10/2005 | Khalid et al. | |
| 7,023,739 B2 * | 4/2006 | Chen et al. | 365/185.28 |
| 7,042,766 B1 * | 5/2006 | Wang et al. | 365/185.22 |
| 7,057,934 B2 | 6/2006 | Krishnamachari et al. | |
| 7,057,936 B2 * | 6/2006 | Yaegashi et al. | 365/185.22 |
| 7,064,980 B2 | 6/2006 | Cernea et al. | |
| 7,215,574 B2 | 5/2007 | Khalid et al. | |
| 7,231,537 B2 | 6/2007 | Nobunaga | |
| 7,269,069 B2 | 9/2007 | Cernea et al. | |
| 7,324,383 B2 | 1/2008 | Incarnati et al. | |
| 7,432,552 B2 | 10/2008 | Park et al. | |
| 7,532,514 B2 | 5/2009 | Cernea et al. | |
| 7,944,757 B2 * | 5/2011 | Moschiano et al. | 365/185.22 |
| 8,045,375 B2 * | 10/2011 | Hemink | 365/185.03 |
| 2007/0263449 A1 | 11/2007 | Yu et al. | |
| 2008/0181014 A1 | 7/2008 | Lee | |
| 2008/0239806 A1 | 10/2008 | Moschiano et al. | |
| 2009/0003061 A1 | 1/2009 | Helm | |
| 2009/0067236 A1 | 3/2009 | Isobe et al. | |
| 2009/0109743 A1 | 4/2009 | Goda et al. | |
| 2009/0109744 A1 | 4/2009 | Aritome | |
| 2009/0109746 A1 | 4/2009 | Aritome | |
| 2009/0109759 A1 | 4/2009 | Aritome | |
| 2009/0113259 A1 | 4/2009 | Aritome | |

OTHER PUBLICATIONS

Application and Drawings as filed, "Memory Kink Checking", U.S. Appl. No. 12/559,275, filed Sep. 14, 2009, Uday Chandrasekhar,et al., Application (45 pgs.), Drawings (7 pgs.).

Application and Drawings as filed, "Architecture and Method for Memory Programming", U.S. Appl. No. 12/365,589, filed Feb. 4, 2009, Tommaso Vali, et al., Application (24 pgs.), Drawings (11 pgs.).

* cited by examiner

*Primary Examiner* — Connie Yoha
(74) *Attorney, Agent, or Firm* — Brooks, Cameron & Huebsch, PLLC

(57) ABSTRACT

This disclosure concerns memory kink compensation. One method embodiment includes applying a number of sequentially incrementing programming pulses to a memory cell, with the sequential programming pulses incrementing by a first programming pulse step voltage magnitude. A seeding voltage is applied after applying the number of sequentially incrementing programming pulses. A next programming pulse is applied after applying the seeding voltage, with the next programming pulse being adjusted relative to a preceding one of the sequentially incrementing programming pulses by a second programming pulse step voltage magnitude. The second programming pulse step voltage magnitude can be less than the first programming pulse step voltage magnitude.

15 Claims, 8 Drawing Sheets

METHOD FOR KINK COMPENSATION IN A MEMORY

TECHNICAL FIELD

The present disclosure relates generally to semiconductor memory methods and devices, and more particularly, to memory kink compensation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory, among others.

Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

Uses for flash memory include memory for sold state drives (SSDs), personal computers, personal digital assistants (PDAs), digital cameras, cellular telephones, portable music players, e.g., MP3 players, and movie players. Data, such as program code, user data, and/or system data, such as a basic input/output system (BIOS), are typically stored in flash memory devices. This data may be used in personal computer systems, among others. Some uses of flash memory may include multiple reads of data programmed to a flash memory device without erasing the data.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to an access line, which is commonly referred to in the art, and herein, as a "word line." However, each memory cell may not be directly coupled by its drain to a data line, which is commonly referred to in the art, and herein, as a "bit line." Instead, the memory cells of the array may be coupled together in series, source to drain, between a common source and a data line, where the memory cells commonly coupled to a particular data line are referred to as a "column."

Memory cells in a NAND array architecture may be programmed to a desired state. For example, electric charge can be placed on or removed from a charge storage node, such as a floating gate, of a memory cell to put the cell into one of a number of program states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells may be referred to as multilevel cells (MLCs).

MLCs may allow the manufacture of higher density memories without increasing the number of memory cells since each cell can represent more than one digit, e.g., more than one bit. For example, a cell capable of representing four digits can have sixteen program states. For some MLCs, one of the sixteen program states may be an erased state. For these MLCs, the lowermost program state is not programmed above the erased state, that is, if the cell is programmed to the lowermost state, it remains in the erased state rather than having a charge applied to the cell during a programming operation. The other fifteen program states may be referred to as "non-erased" states.

Two configurations used for programming memories are shielded and non-shielded. In non-shielded configurations, all bit line (ABL) programming can be used to simultaneously program all of the cells coupled to a particular access line, e.g., utilizing all bit lines. In shielded bit line (SBL) configurations, alternating memory cells on an access line can be programmed together, e.g., alternating bit lines are used. One or both bit lines adjacent to bit lines being programmed can be inhibited by application of an inhibit voltage.

ABL programming can provide faster programming operations compared to SBL programming, since all of the cells coupled to a particular access line can be programmed at the same time. However, in non-shielded configurations, capacitive coupling between memory cell components, e.g., components of adjacent memory cells, can have adverse effects on the memory cell being programmed. Memory cell components that may be capacitively coupled can include charge storage nodes, e.g., floating gates, channels, and bit lines, among others.

DETAILED DESCRIPTION

Figure 1:
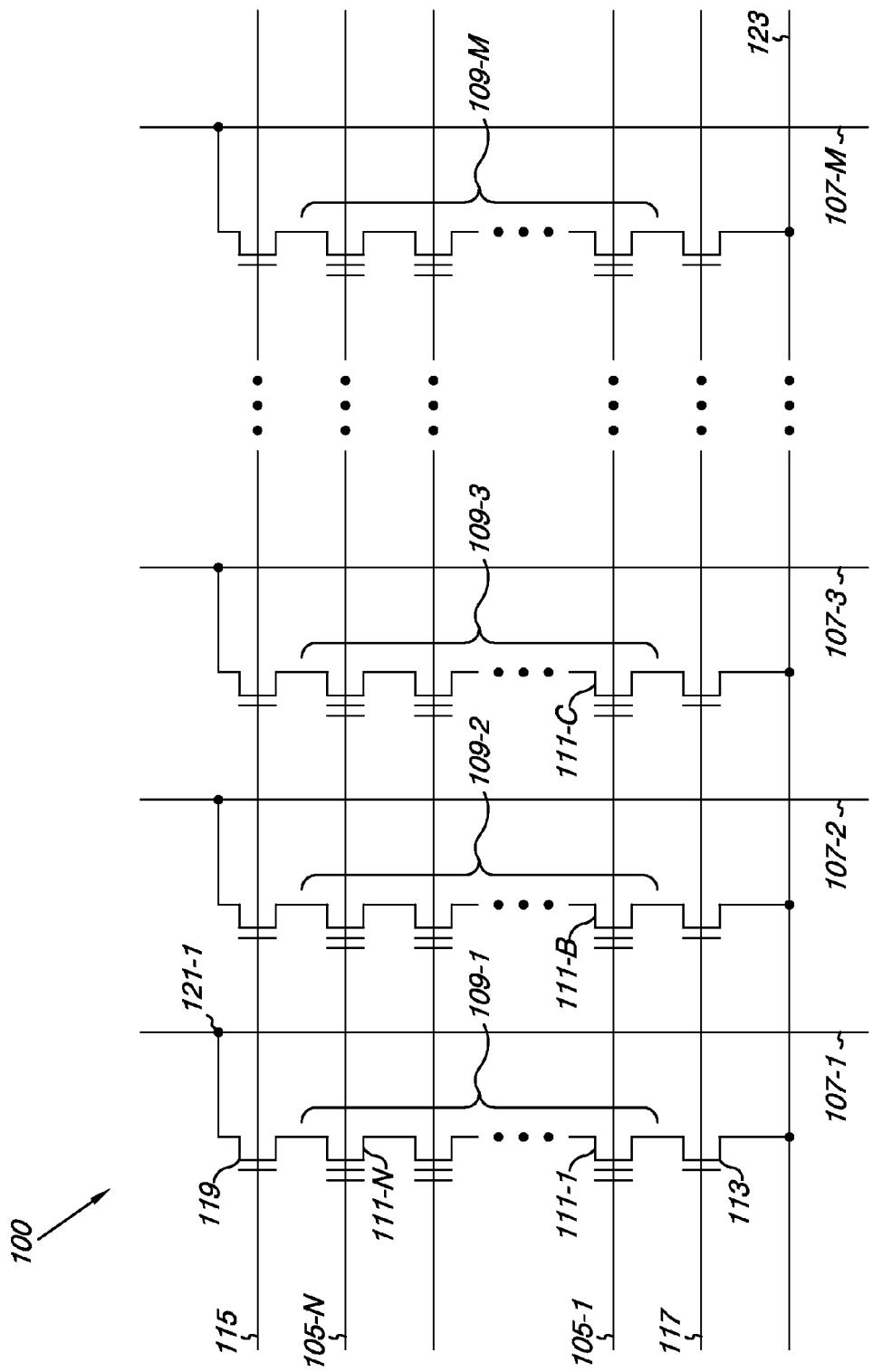
FIG. 1 is a schematic of a portion of a non-volatile memory array in accordance with one or more embodiments of the present disclosure.

The present disclosure includes methods and devices for memory kink compensation. One method embodiment includes applying a number of (e.g., one or more) sequentially incrementing programming pulses to a memory cell, with the sequential programming pulses incrementing by a first programming pulse step voltage magnitude. A seeding voltage is applied, for example as mitigation of programming pulse magnitude, after applying the number of sequentially incrementing programming pulses. A next programming pulse is applied after applying the seeding voltage, with the next programming pulse being adjusted by a second programming pulse step voltage magnitude. The second programming pulse step voltage magnitude can be less than the first programming pulse step voltage magnitude.

Another method embodiment includes applying a number of programming pulses to the memory cell until a threshold voltage (Vt) of the memory cell is greater than or equal to a pre-program verify voltage level and less than a program verify voltage level. A programming pulse step voltage magnitude is adjusted for a next programming pulse to be applied to the memory cell.

Yet another method embodiment includes determining a number of memory cells affected by kink after application of a particular programming pulse, for example, by determining a number of columns of memory cells affected by kink. If the determined number is greater than or equal to a threshold number, for a next programming pulse after the particular programming pulse, a programming pulse step voltage magnitude is adjusted.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure. A number of the particular feature can mean one or more.

The figures herein follow a numbering convention in which the first digit or digits correspond to the drawing figure number and the remaining digits identify an element or component in the drawing. Similar elements or components between different figures may be identified by the use of similar digits. For example, 107 may reference element "07" in FIG. 1, and a similar element may be referenced as 207 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate embodiments of the present invention, and should not be taken in a limiting sense.

FIG. 1 is a schematic of a portion of a non-volatile memory array 100 in accordance with one or more embodiments of the present disclosure. The embodiment of FIG. 1 illustrates a NAND architecture non-volatile memory. However, embodiments described herein are not limited to this example. As shown in FIG. 1, the memory array 100 includes access lines, e.g., word lines 105-1, ..., 105-N and corresponding data lines, e.g., local bit lines 107-1, 107-2, 107-3, ..., 107-M. For ease of addressing in the digital environment, the number of word lines 105-1, ..., 105-N and the number of local bit lines 107-1, 107-2, 107-3, ..., 107-M can be some power of two, e.g., 256 word lines by 4,096 bit lines.

Memory array 100 includes NAND strings 109-1, 109-2, 109-3, ..., 109-M. Each NAND string includes non-volatile memory cells 111-1, ..., 111-N, each associated with a respective word line 105-1, ..., 105-N. Each NAND string (and its constituent memory cells) is also associated with a local bit line 107-1, 107-2, 107-3, ..., 107-M. The non-volatile memory cells 111-1, ..., 111-N of each NAND string 109-1, 109-2, 109-3, ..., 109-M are connected in series source to drain between a source select gate (SGS), e.g., a field-effect transistor (FET) 113, and a drain select gate (SGD), e.g., FET 119. Each source select gate 113 is configured to selectively couple a respective NAND string 109 to a common source 123 responsive to a signal on source select line 117, while each drain select gate 119 is configured to selectively couple a respective NAND string to a respective bit line 107 responsive to a signal on drain select line 115. Memory cells 111-1, 111-B, and 111-C are all coupled to word line 105-1, and are associated with bit lines 107-1, 107-2, and 107-3 respectively.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of non-volatile memory cells, 111-1, ..., 111-N, includes a source, a drain, a floating gate or other charge storage node, and a control gate. Non-volatile memory cells, 111-1, ..., 111-N, have their control gates coupled to a word line, 105-1, ..., 105-N respectively. A "column" of the non-volatile memory cells, 111-1, ..., 111-N, make up the NAND strings, e.g., 109-1, 109-2, 109-3, ..., 109-M, and are coupled to a given local bit line, e.g., 107-1, 107-2, 107-3, ..., 107-M respectively. A "row" of the non-volatile memory cells are those memory cells commonly coupled to a given word line, e.g., 105-1, ..., 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, ..., 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected word line to a desired voltage level corresponding to a desired program state.

A sensing operation, such as a read or program verify operation, can include sensing a voltage and/or current change of a bit line coupled to a selected cell in order to determine the state of the selected cell. The sensing operation can involve applying, e.g., biasing or driving, a voltage to a bit line, e.g., bit line 107-1, associated with a selected memory cell above a voltage applied to a source, e.g., source line 123, associated with the selected memory cell. A sensing operation could alternatively include precharging the bit line 107-1 followed with discharge when a selected cell begins to conduct, and sensing the discharge.

Sensing the state of a selected cell can include applying a number of sensing voltages, e.g., read voltages "Vread," to a selected word line while applying a number of voltages to the word lines coupled to the unselected cells of the string sufficient to place the unselected cells in a conducting state independent of the threshold voltage of the unselected cells, e.g., pass voltages "Vpass". The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, data stored in the selected cell can be based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

A program verify operation can include applying a number of program verify voltages to a selected word line, e.g., after a programming pulse, to determine whether a memory cell coupled to the selected word line has reached a desired program state. In association with the program verify operation, a cache element can store a programming status of the selected memory cell, e.g., whether the selected memory cell has reached the desired program state. For example, the programming status of the selected memory cell can include one of programming complete and programming incomplete.

Prior to performing the program verify operation, the programming status of the selected memory cell can indicate that programming is incomplete. If the program verify operation determines that the selected memory cell has reached a desired program state, then the programming status (stored in the cache element) can be changed to indicate that programming is complete. Such a change in programming status can affect whether or not the selected memory cell will be program inhibited during subsequent programming pulse. For example, if the programming status stored in the cache element is programming incomplete, then the selected memory cell will not be program inhibited during a subsequent programming pulse applied to the selected word line. However, if the programming status stored in the cache element is programming complete, then the selected memory cell will be program inhibited during a subsequent programming pulse applied to the selected word line.

Figure 2:
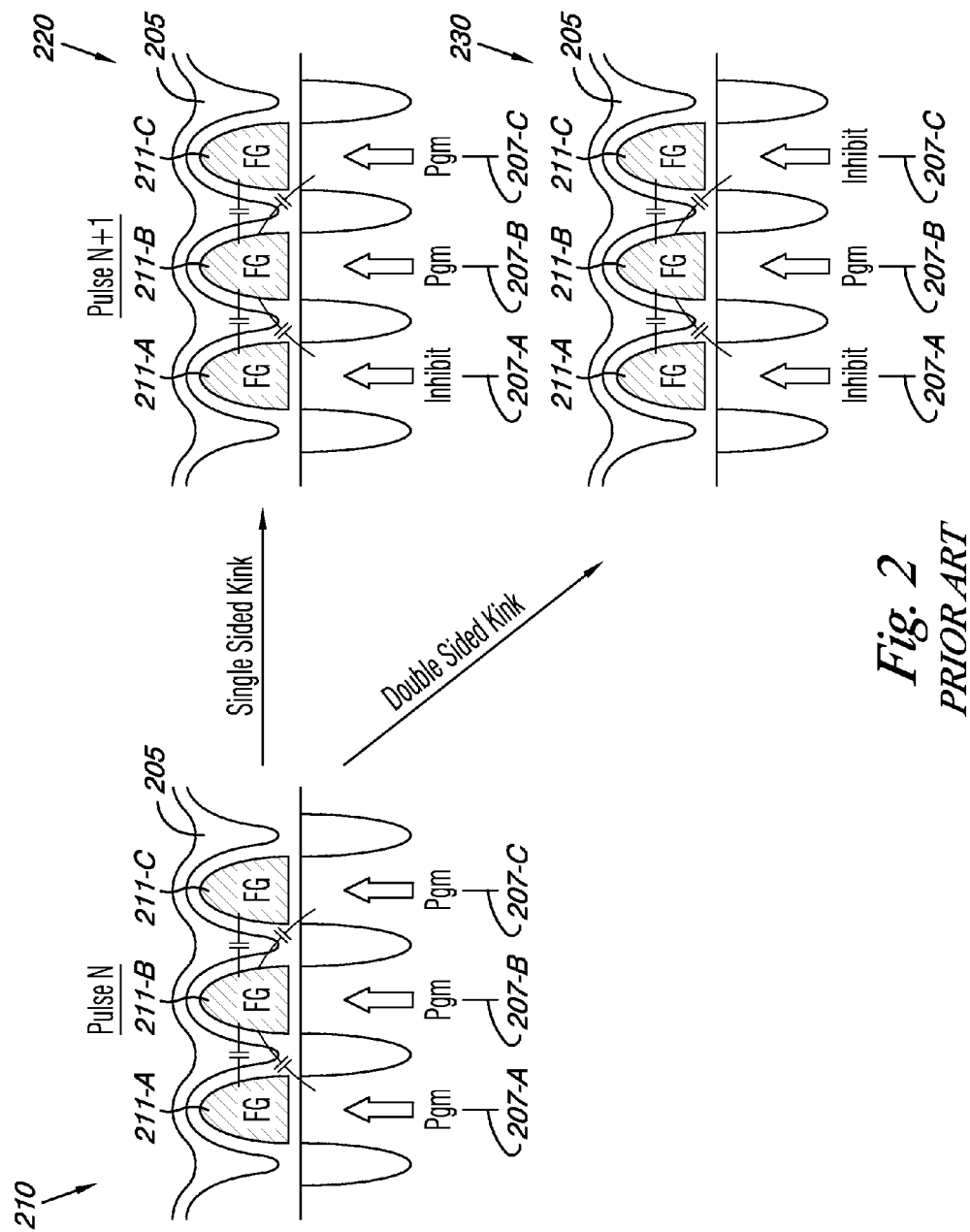
FIG. 2 is a prior art illustration of capacitive coupling between memory cell components.

FIG. 2 is a prior art illustration of capacitive coupling between memory cell components. The first cross-sectional representation of memory cells 210 illustrates a first programming pulse, e.g., "Pulse N." The cross-sectional representation of memory cells 220 and the cross-sectional representation of memory cells 230 each illustrate a different variation of a second programming pulse, e.g., "Pulse N+1." As one of ordinary skill in the art will appreciate, a program verify operation can be performed between programming pulses to determine whether a selected memory cell has reached a desired program state, e.g., whether the selected memory cell will be program inhibited during a subsequent programming pulse.

As illustrated in the cross-sectional representation of memory cells, three memory cells 211-A, 211-B, and 211-C are shown in the process of having their charge storage nodes, e.g., floating gates "FG," programmed. The layout of the bit lines 207-A, 207-B, and 207-C illustrated in FIG. 2 is a simplified representation of memory cells arranged to enable showing capacitive coupling between memory cell components, such as between the charge storage node, e.g., floating gate, of one memory cell and the floating gates and channels of adjacent memory cells. FIG. 2 is intended to show an association between the memory cells 211-A, 211-B, and 211-C and the bit lines 207-A, 207-B, and 207-C respectively, rather than a particular actual physical fabrication configuration. For example, bit lines typically are not arranged directly beneath the floating gate of a memory cell, and one of ordinary skill in the art will appreciate that bit lines may be formed in a number of locations with respect to the memory cells with which they are associated.

Memory cells 211-A and 211-C are oppositely adjacent to the memory cell 211-B. The memory cells 211-A, 211-B, and 211-C are coupled to a word line 205. Each memory cell is associated with, e.g., coupled to, a corresponding bit line, e.g., bit lines 207-A, 207-B, and 207-C. Thus, bit lines 207-A and 207-C are oppositely adjacent to bit line 207-B.

Memory cells 211-A, 211-B, and 211-C, coupled to word line 205, can be analogous to memory cells 111-1, 111-B, and 111-C, coupled to word line 105-1 in FIG. 1. Likewise bit lines 207-A, 207-B, and 207-C can be analogous to bit lines 107-1, 107-2, and 107-3 in FIG. 1. The cross-sectional representation of memory cells 210, 220, and 230 illustrate capacitive coupling between the floating gate of memory cell 211-B and the floating gates of adjacent memory cells 211-A and 211-C, represented by the capacitor symbols therebetween. The cross-sectional representation of memory cells 210, 220, and 230 also illustrate capacitive coupling between the floating gate of memory cell 211-B and channel regions underlying adjacent memory cells 211-A and 211-C, represented by the capacitor symbols therebetween. As memory devices are scaled to smaller sizes, capacitive coupling between memory cell components can increase because of the shorter distances between the memory cell components.

As illustrated in cross-sectional representation of memory cells 220, applying a program inhibit voltage to one adjacent bit line, e.g., bit line 207-A, can effectively turn off the drain select transistor, e.g., drain select transistor 119 illustrated in FIG. 1, and disconnect the NAND string, e.g., NAND string 109-1, from its associated bit line, e.g., bit line 107-1. This, in turn, floats the channels associated with the memory cells of the NAND string so that a respective channel, e.g., the channel associated with memory cell 211-A, can be boosted to a voltage roughly proportional to a voltage applied to a respective word line, e.g., word line 205, associated with a respective memory cell. Boosting the channel in this manner, e.g., to approximately equal the voltage applied to the word line, can effectively reduce a potential difference between the channel and the charge storage node, e.g., the floating gate, which can inhibit programming of the memory cell by discouraging electron transfer between the channel and the charge storage node.

During a programming operation of a selected memory cell, such as an ABL programming operation of memory cell 211-B, a program enable voltage, e.g., 0 V, can be applied to a bit line associated with the selected memory cell, e.g., bit line 207-B. Thus, as illustrated in cross-sectional representation of memory cells 210, during an example programming pulse in which the three adjacent memory cells 211-A, 211-B, and 211-C are all receiving the programming pulse, all three adjacent bit lines 207-A, 207-B, and 207-C have the same voltage applied thereto, e.g., a program enable voltage "Pgm." Likewise, since the three memory cells 211-A, 211-B, and 211-C are coupled to the same word line 205, a control gate of each memory cell 211-A, 211-B, and 211-C can have the same voltage applied thereto. Accordingly, there may be little adverse effect on memory cell 211-B because the adjacent bit lines 207-A and 207-C and corresponding channel regions are at essentially the same voltage as those associated with memory cell 211-B.

The cross-sectional representation of memory cells 220 illustrates a programming pulse subsequent to Pulse N, e.g., Pulse N+1, in which one of the memory cells, e.g., memory cell 211-A, adjacent to memory cell 211-B is program inhibited. As a programming pulse for memory cells associated with word line 205 is applied to word line 205, a number of memory cells that have completed programming can be inhibited from further programming, e.g., program disturb, by applying an inhibit voltage to the bit lines associated with those cells. For example, in cross-sectional representation of memory cells 220, an inhibit voltage is applied to bit line 207-A to inhibit memory cell 211-A from further programming while memory cells 211-B and 211-C receive additional charge from the programming Pulse N+1 applied to word line 205. An inhibit voltage applied to a bit line may generally be larger than a program enable voltage applied to a bit line.

Applying a program inhibit voltage to a bit line associated with a memory cell coupled to a selected word line, e.g., selected for programming, can effectively turn off a select transistor, e.g., applying a program inhibit voltage to bit line 107-1 can turn off drain select gate 119, as illustrated in FIG. 1. Turning off the select transistor can electrically disconnect a NAND string associated with the select transistor from the bit line, which can float a channel region underlying the memory cells of the NAND string.

With respect to cross-sectional representation of memory cells 220, the program inhibit voltage applied to bit line 207-A can float the channel underlying memory cell 211-A, which can allow the channel to be boosted to the voltage applied to the word line 205 during the programming Pulse N+1. As such, the channel voltage associated with memory cell 211-A can be greater than the channel voltage associated with memory cell 211-B during programming Pulse N+1. Accordingly, the programming of the memory cell 211-B can be effected through the capacitive coupling between memory cell components. The voltage effecting memory cell 211-B is the voltage attributable to the word line 205 plus some voltage due at least in part to capacitive coupling between the floating gate of memory cell 211-B and the channel underlying memory cell 211-A, e.g., kink effect.

Kink effect (hereinafter "kink") refers to the effect on a charge storage node, e.g., floating gate, of the memory cell being programmed due to charge leakage through capacitive coupling from voltages other than the word line voltage. For example, the inhibit voltage on an adjacent memory cell bit line can contribute to the charge stored on an adjacent floating gate being programmed through the capacitive coupling between memory cell components. Kink can also be induced from other voltages, such as seeding voltages (discussed later).

In general, kink can occur due to the effect from one adjacent memory cell, e.g., single-sided kink, or due to the effect of adjacent memory cells on each side of a particular memory cell, e.g., double-sided kink. For example, the delta Vt shift due to a programming pulse can be a nominal 500 mV and the delta Vt shift due to a single-sided kink can be approximately 150 mV. Thus, the single-sided kink can increase the programming effect on a memory cell being programmed from the intended programming voltage step magnitude of 500 mV, to the equivalent of a programming voltage step magnitude of 650 mV. Such an unintended effective increase in programming voltage step magnitude can cause the memory cell being programmed to receive more charge than is intended, and lead to over-programming. Over-programming can contribute to sensing errors such as read errors and/or program verify errors, by shifting the threshold voltage (Vt) of the memory cell to a higher level, e.g., to a different program state.

The cross-sectional representation of memory cells 230 illustrates a programming pulse subsequent to Pulse N, e.g., Pulse N+1, in which both of the memory cells, e.g., memory cells 211-A and 211-C, adjacent to memory cell 211-B are being program inhibited. For example, in cross-sectional representation of memory cells 230, an inhibit voltage is applied to bit lines 207-A and 207-C to inhibit memory cells 211-A and 211-C from further programming while memory cell 211-B receives additional charge from the programming Pulse N+1 applied to word line 205. With respect to cross-sectional representation of memory cells 230, the program inhibit voltage applied to bit lines 207-A and 207-C can float the channels underlying memory cells 211-A and 211-C, which can allow the channels to be boosted to the voltage applied to the word line 205 during the programming Pulse N+1. The channel voltage associated with memory cells 211-A and 211-C can be greater than the channel voltage associated with memory cell 211-B during programming Pulse N+1. As such, a double sided kink can affect the programming of the memory cell 211-B. That is, the effective voltage applied to memory cell 211-B is the voltage applied to the word line 205 plus some kink due at least in part to capacitive coupling between the floating gate of memory cell 211-B and the channels underlying memory cells 211-A and 211-C.

Double sided kink causes an effective programming voltage step increase larger than single sided kink. Assuming the delta Vt shift due to a single-sided kink can be approximately 150 mV in the numerical example given above, then double sided kink can be approximately 300 mV, which can increase a programming voltage step magnitude from the intended 500 mV, to the equivalent of a programming voltage step magnitude of 800 mV. As with single-sided kink, such an increase in programming voltage step magnitude can contribute to operational errors for the memory cell being programmed.

Figure 3:
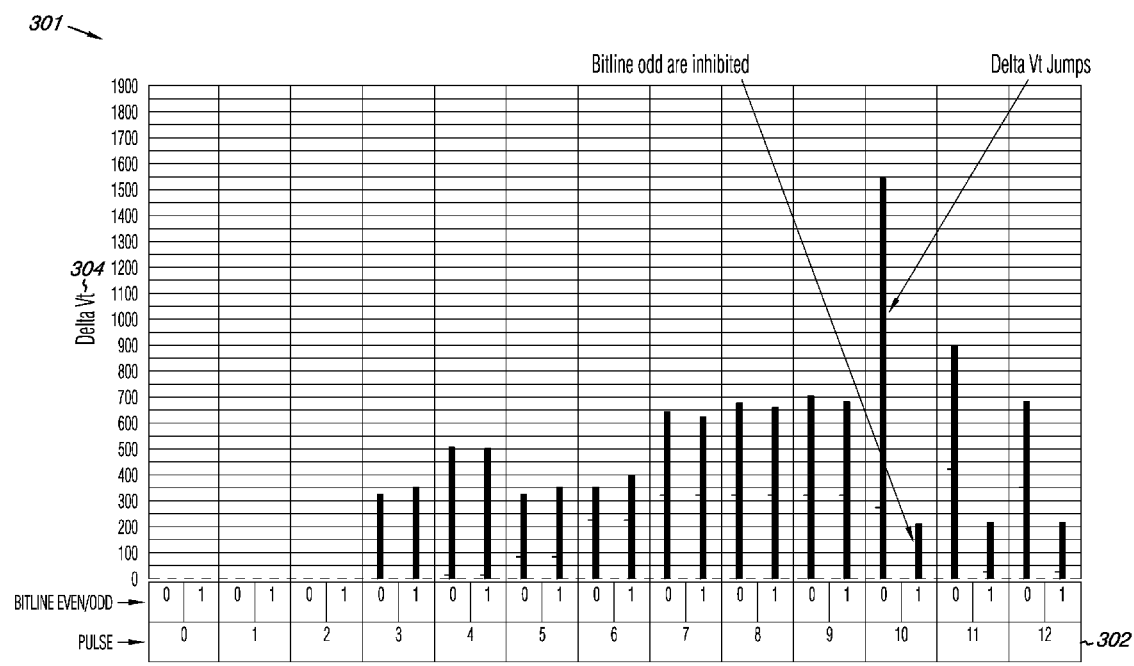
FIG. 3 is prior art a chart graphically illustrating a kink effect in a memory.

FIG. 3 is a chart 301 graphically illustrating a kink effect in a memory. FIG. 3 illustrates the results of a programming pulse sequence for even and odd bit lines, with the particular programming pulse number shown on the horizontal axis 302. Average delta Vt is shown on the vertical axis 304.

ABL programming programs all bit lines of the memory at the same time. As previously discussed, this can lead to kink due to capacitive coupling between memory cell components. This can also lead to a change in the threshold voltage of a memory cell (delta Vt) on the target bit line that is larger than the delta Vt that occurs for previous (or subsequent) programming pulses that increment, for example, by an equal programming pulse step voltage magnitude, e.g., delta Vpgm.

In this example, as programming is initiated, no bit lines are inhibited since no memory cells are programmed to the desired program state yet. However, in some instances, cells can be left in an erased states, e.g., certain bit lines may be inhibited as programming is initiated, resulting in kink occurring earlier in a programming process. Chart 301 shows the first three programming pulses, e.g., 0-2, having no measurable effect on the average delta Vt of the memory cells associated with either the even or odd bit lines. The next several programming pulses, e.g., 3-9, show substantially similar effect on the average delta Vt of the memory cells associated with both the even and odd bit lines, with an average delta Vt limited to approximately 350 mV. Still, no memory cells are being inhibited because they have not reached the desired program state to which they are being programmed.

The occurrence of kink is shown graphically in chart 301 of FIG. 3 at programming pulse 10. At programming pulse 10, an inhibit voltage is placed on the odd bit lines, as shown by the reduction of delta Vt from about 600 mV to about 200 mV, e.g., for memory cells on odd bit lines that have already reached their desired program state and do not require further programming. The inhibiting voltage applied to the number of odd bit lines causes kink to the memory cells associated with even bit lines through the capacitive coupling between memory cell components, e.g., the floating gates of the memory cells associated with the even bit lines and channels of the memory cells associated with odd bit lines already at their desired program state.

Thus, due to the increased effect of kink, the total effect on the average delta Vt of the memory cells associated with the even bit lines increases significantly, e.g., to approximately 1550 mV. That is, due to kink at programming pulse 10, the average delta Vt on the memory cells is disproportionately larger than the average delta Vt associated with other programming pulses. Such a large delta Vt can cause memory cells on the even bit lines at programming pulse 10 to over-program to an erroneous program state. The reader can appreciate that compensating for the effects of kink to achieve expected memory cell programming results is desirable.

Voltages other than inhibit voltages applied to bit lines of a number of memory cells can result in kink. For example, the floating gate of a particular memory cell can also be capacitively coupled to the channel of a number of adjacent memory cells, and voltages on those channels, other than inhibit voltages, can contribute to kink through capacitive coupling between memory cell components.

In some memory arrays that are programmed using sequentially incrementing programming pulses, after some number of programming pulses, the high voltage programming pulses (resulting from being incremented a number of times) can cause a larger delta Vt increment to the programmed voltage of a memory cell being programmed. That is, high voltage programming pulses can cause program disturb—an effective jump in delta Vt beyond a desired Vt. In general, a substantially similar change to the memory cell programmed voltage may occur for each programming pulse; therefore, the larger than expected delta Vt increments due to program disturb caused by high programming pulse voltage magnitude can be problematic.

One method used to address the use of high voltage programming pulses, and the resulting program disturb changes to delta Vt they cause, is by using a seeding event. High voltage programming pulses applied to a word line establishes the high voltage differentials needed to transfer charge to the floating gate. However, high voltage differentials can be created in other ways, such as by boosting channel voltages, or applying a "negative" starting voltage to the word line. These, and other similar measures, are referred to herein as "seeding" events.

Application of an additional "seeding" voltage 444, either by globally boosting channel voltages, or globally applying a "negative" starting voltage to word lines, introduces new voltages to components of the memory cells, and these new voltages can lead to new, or increased kink, through the capacitive coupling between memory cell components. Seeding voltage causes the source, drain and channel of the inhibited cell strings to couple higher, thus better inhibiting program disturb, and can reduce the unintended increase in delta Vt due to high magnitude programming pulses since large voltage differentials can be realized using lower programming pulse magnitudes.

However, seeding also has the undesirable effect of coupling the increased source, drain and channel boost from the inhibited string to the charge storage nodes, e.g., floating gates, of the cells being programmed. This capacitive coupling between memory cell components, in particular to the charge storage nodes, e.g., floating gate, of a memory cell being programmed, can cause additional kink. Like other sources of kink, insertion of a seed can lead to the memory cells being over-programmed on a subsequent programming pulse. Therefore, kink compensation after a seeding event can be beneficial.

According to one or more embodiments of the present disclosure, immediately after the seeding event, the program step voltage of a programming pulse applied to the word line is adjusted for a number of programming pulses in order to mitigate the opportunity for over-programming due to kink. In some embodiments, the compensation of a number of programming pulses results in the effective program step voltage, and the associated delta Vt experienced by the target memory cell(s) charge storage node, e.g. floating gate, to behave as it would absent the seeding event.

Figure 4:
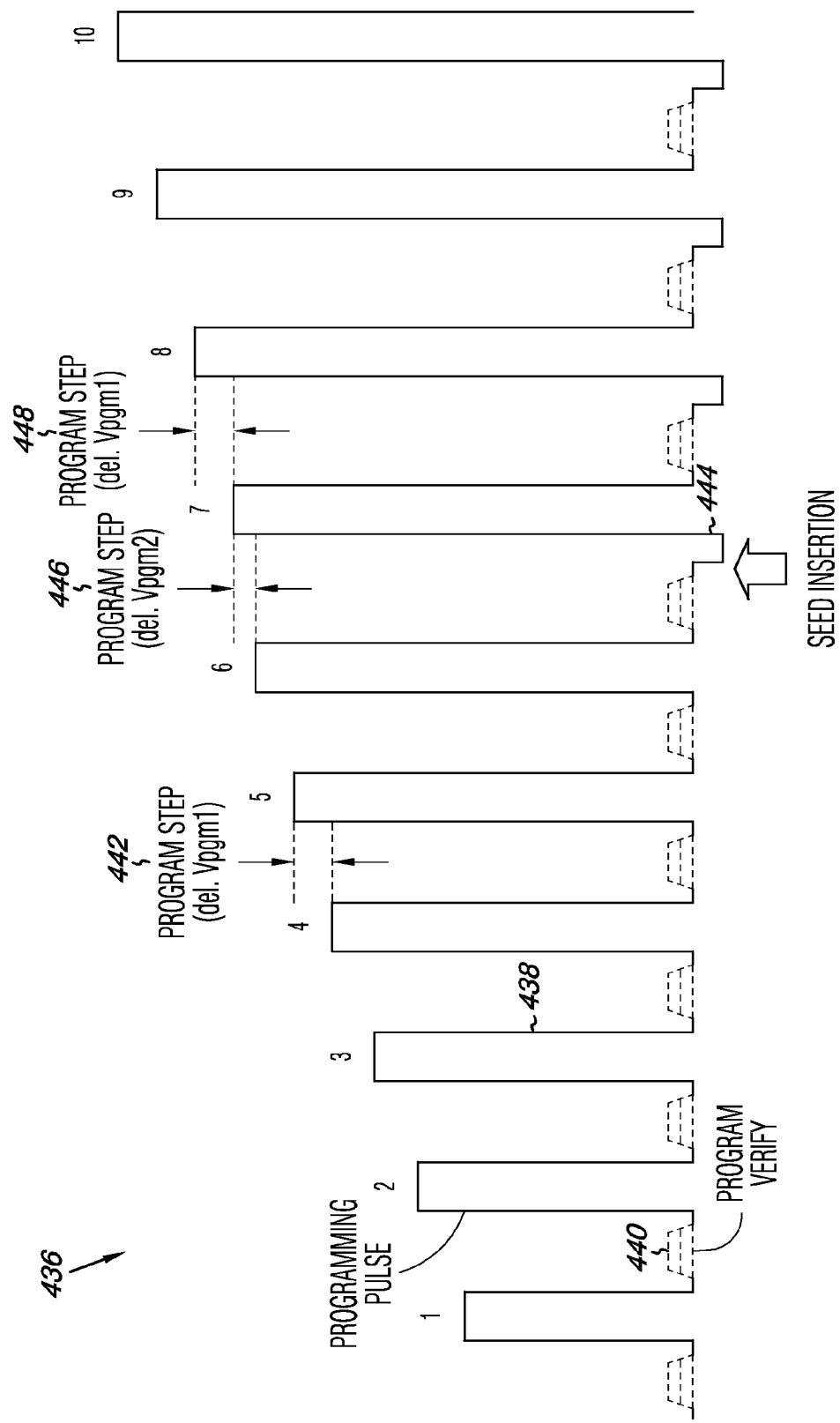
FIG. 4 is a graph illustrating programming step voltage adjustment in compensation for seed insertion according to one or more embodiments of the present disclosure.

FIG. 4 is a graph illustrating programming step voltage adjustment in compensation for seed insertion according to one or more embodiments of the present disclosure. FIG. 4 illustrates a series 436 of programming pulses 438, as may be applied to a word line for programming a particular memory cell. A program verify operation 440 can be performed between programming pulses 438. Initial programming pulses (e.g. 1-6) show sequentially incrementing programming pulses, where the program step voltage is the same for each sequential programming pulse, e.g., delta Vpgm1 442.

According to various embodiments, seed insertion is a one time event, and seed insertion causes a one time change in kink. For example, a seeding voltage may be added to boost the inhibit voltage on the bit line of adjacent memory cells, and boost the inhibited channel higher than on previous pulses. This higher boost voltage, which is capacitively coupled between memory cell components to the charge storage node, e.g., floating gate, of a memory cell being programmed, can cause the delta Vt increment to be larger than expected.

Seed insertion is often a one time event. However, once a seeding voltage is applied, it remains applied into the future. Seed insertion 444 is illustrated in FIG. 4 as a "negative" starting voltage being applied to the word line. FIG. 4 illustrates that immediately after a one time seed insertion 444 before programming pulse 7, the program step voltage is compensated, such that the program step voltage Vpgm2 446, rather than the previous Vpgm1 442. As seed insertion, and its kink effects can be a one time event, programming pulses subsequent to programming pulse 7, e.g., programming pulse 7 being the next programming pulse following seed insertion, include a program step voltage 448 of Vpgm1, as shown in FIG. 4 for programming pulse 8.

According to one or more embodiments, the decrease in program step is selected to offset the increase in effect to delta Vt due to kink from the presence of the additional seeding voltage. FIG. 4 shows the magnitude of Vpgm2 being substantially equal to Vpgm1 less the seeding voltage 444. As an example, a program step voltage, e.g., Vpgm1, can be 500 mV. Thus a programming pulse can increase from 15.0 V to 15.5 V after a number of programming pulses have been applied, and an inhibit voltage of adjacent bit lines may be increased by seed insertion from 10 V to 12 V, e.g., applying 2 V of seeding.

The 2 V increase in inhibit voltage due to seed insertion can result, for example, in 200 mV of new kink to a memory cell being programmed for single-sided kink, e.g., where only one adjacent memory cell is inhibited, and 400 mV of new kink to a memory cell being programmed for double-sided kink, e.g., where two adjacent memory cells are inhibited. In programming memory cells using an ABL configuration, the worst case kink due to seeding is double-sided kink, e.g., 400 mV. Thus, the program step voltage for the programming pulse immediately after seed insertion can be reduced from 500 mV, e.g., Vpgm1, to 100 mV, e.g., Vpgm2=500−400, so as to offset double-sided kink effect and avoid over-programming.

Memory cells being programmed immediately after a seeding event using a program step voltage of only 100 mV, e.g., Vpgm2, that are effected by double-sided kink will experience 100 mV delta Vt shift due to the kink-compensated program step voltage plus the 400 mV double-sided kink effect. Thus, the memory cell being programmed will experience a total of 500 mV delta Vt, as desired if kink were not present.

Seeding is a global event, e.g., all word lines are subject to the negative starting voltage to counteract high programming pulse magnitudes. Therefore, kink attributable to seeding is a global effect as well. According to one or more embodiments of the present disclosure, compensating for kink due to seeding is therefore also a global event. That is, the program step voltage for programming pulses to all memory cells immediately after a seeding event are compensated for double-sided kink. However, while some target memory cells being programmed may be impacted by double-sided kink, others may only be impacted by single-sided kink. Those target memory cells only impacted by single-sided kink, but which are programmed by a programming pulse compensated for double-sided kink will experience a reduced delta Vt change. For example, those memory cells being programmed by a programming pulse immediately after a seeding event, and thus having only 100 mV program step voltage, e.g., Vpgm2, but only affected by single-sided kink, will experience 100 mV delta Vt change due to the program step voltage, plus the 200 mV single-sided kink effect, for a total of 300 mV delta Vt change (compared with the 500 mV Vt change that memory cells being programmed that are impacted by double-sided kink experience).

Likewise, those memory cells being programmed by a programming pulse immediately after a seeding event and having only 100 mV program step voltage, e.g., Vpgm2, but not impacted by single-sided or double-sided kink, will only experience the 100 mV effect due to the program step voltage, but not any effect from kink. As will be appreciated, the programming resolution on those memory cells being programmed that are impacted by single-sided kink or no kink, due to the global compensation for the worst case double-sided kink, is tighter, and more desirable than the risk of over-programming. Additional programming pulses can be applied to increase floating gate charge for a particular cell to reach a desired program state.

Embodiments of the present disclosure are not however, limited to any particular amount of kink compensation, e.g., adjustment of the program step voltage magnitude for double-sided kink compensation. That is, the program step magnitude can be adjusted for double-sided kink compensation, single-sided kink compensation, or some other amount (more or less) of compensation. Nor are embodiments limited to a one-time kink compensation, or kink compensation on only the next programming pulse. According to one or more embodiments, a number of programming pulses (e.g., program step voltage magnitudes) following a seed insertion can be kink compensated.

For example in some embodiments, seeding voltages may be applied or changed more than once, and programming step voltage adjustment can be applied as described herein to compensate for each, or some, of the seeding events. Furthermore, the programming step compensation may be applied over more than one programming pulse, or applied after some number of programming pulses following the seed insertion, or using combinations thereof.

Depending on the extent of kink effect, which may be related to memory cell geometry, materials, or magnitude of seeding, etc., compensation for seeding may reduce a program step voltage magnitude (as illustrated in FIG. 4 and as described above), including to the point of effectively eliminating a step in voltage, e.g., the next programming pulse following a seed insertion may be substantially equal in magnitude to the programming pulse just prior to the seed insertion, or offsetting the programming step voltage such that the next programming pulse following a seed insertion is less in magnitude than the programming pulse just prior to the seed insertion.

Figure 5A:
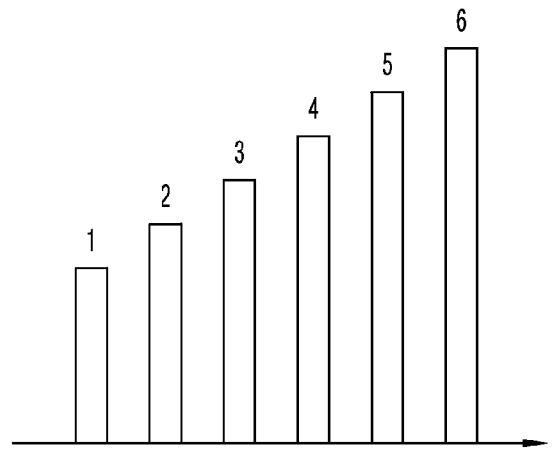
FIGS. 5A-5C are graphs illustrating various programming step voltage adjustments for memory kink compensation according to one or more embodiments of the present disclosure.
Figure 5B:
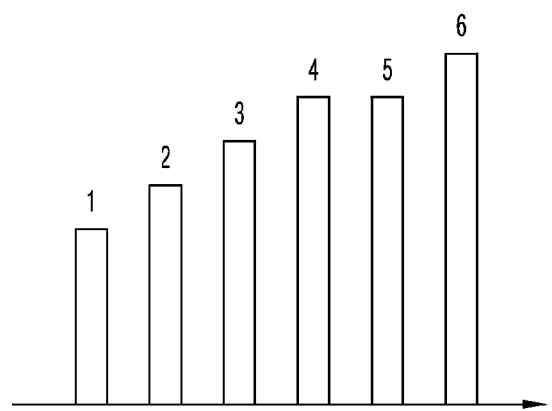
Figure 5C:
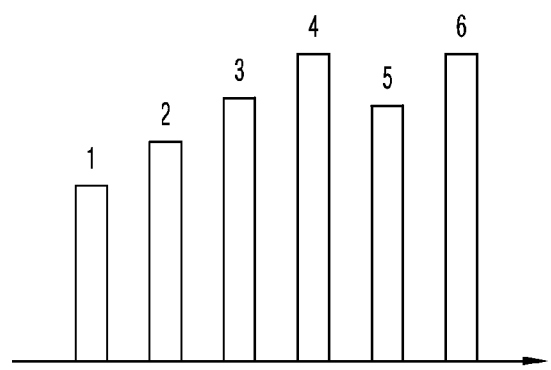

FIGS. 5A-5C are graphs illustrating various programming step voltage adjustments for memory kink compensation according to one or more embodiments of the present disclosure. FIG. 5A shows a number of sequentially incrementing programming pulses, such as may be applied to memory cells being programmed of the memory. The sequential programming pulses are increment by a first programming pulse step voltage magnitude, e.g., Vpgm1 shown in FIG. 4.

FIG. 5B shows a number of sequentially incrementing programming pulses for pulses 1-4, such as may be applied to memory cells being programmed of the memory. The sequential programming pulses 1-4 increment by a first programming pulse step voltage magnitude, e.g., Vpgm1 shown in FIG. 4. Programming pulse 5 is shown being adjusted for kink compensation. In the instance illustrated in FIG. 5B, programming pulse 5 is substantially equal in magnitude to programming pulse 4, e.g., the programming step voltage is essentially zero for programming pulse 5. That is, programming pulse 5 increments by a second programming pulse step voltage magnitude, e.g., Vpgm2 shown in FIG. 4, where the second programming pulse step voltage magnitude is zero. Programming pulse 6 is shown in FIG. 5B as being greater in magnitude than programming pulse 5, like pulses 1-4, incrementing by the first programming pulse step voltage magnitude, e.g., Vpgm1 shown in FIG. 4.

FIG. 5C shows a number of sequentially incrementing programming pulses for pulses 1-4, such as may be applied to memory cells being programmed of the memory. The sequential programming pulses 1-4 increment by a first programming pulse step voltage magnitude, e.g., Vpgm1 shown in FIG. 4. Programming pulse 5 is shown being adjusted for kink compensation, e.g., after an event triggering kink compensation. In the instance illustrated in FIG. 5C, programming pulse 5 is shown being less in magnitude than programming pulse 4, e.g., the programming step voltage is negative for programming pulse 5. That is, programming pulse 5 increments by a second programming pulse step voltage magnitude, e.g., Vpgm2 shown in FIG. 4, where the second programming pulse step voltage magnitude is negative. Programming pulse 6 is shown in FIG. 5B as being greater in magnitude than programming pulse 5, like pulses 1-4, incrementing by the first programming pulse step voltage magnitude, e.g., Vpgm1 shown in FIG. 4.

Figure 6A:
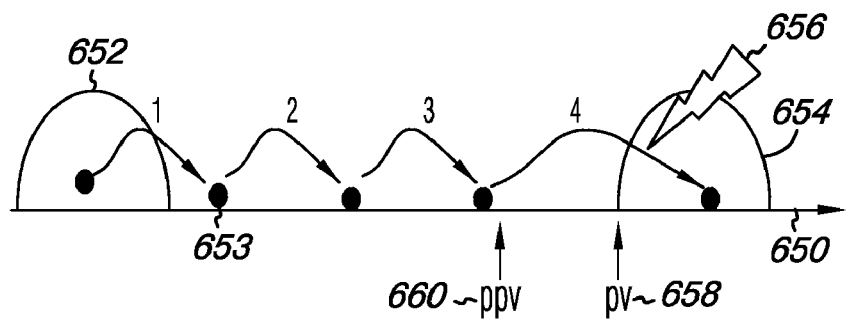
FIGS. 6A-6B are graphs showing memory cell programmed voltage profiles and illustrating various kink effects.
Figure 6B:
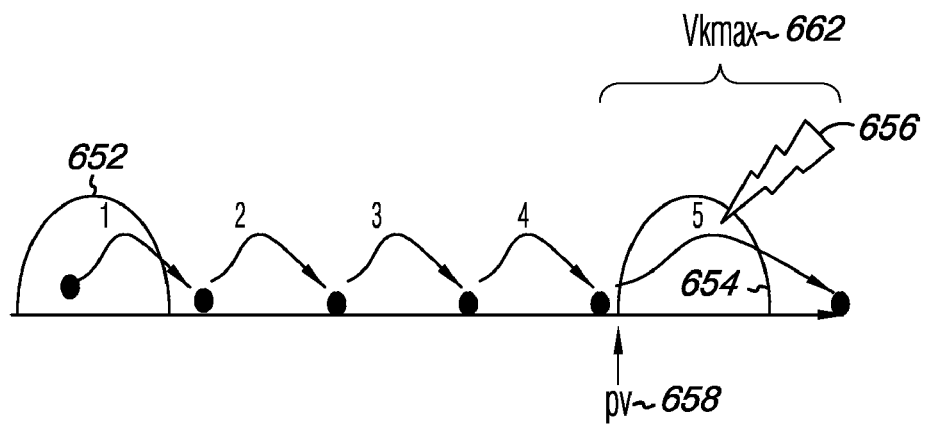

FIGS. 6A-6B are graphs showing memory cell programmed voltage profiles and illustrating various effects due to kink. In ABL programming, when a number of bit lines for a memory cell adjacent a memory cell being programmed are inhibited, a programming pulse can result in a large delta Vt change due to the cumulative effect from the intended programming pulse and the unintended kink effect. The resulting delta Vt change can be much larger than the expected delta Vt, e.g., from previous programming pulses. If a programming pulse and kink effect occur to produce the large delta Vt at a time when the memory cell on the target bit line is approaching a desired program state, the memory cell can easily be over-programmed (and result in runaway programming).

Kink due to capacitive coupling from inhibited bit lines of memory cells adjacent a memory cell being programmed typically occurs after some number of programming pulses are applied to the memory cell being programmed, e.g., after adjacent memory cells have reached their program state and are inhibited from further programming. Thus, the memory cells still being programmed are frequently approaching the desired program state when kink occurs. Thus, kink can be detrimental due to delta Vt overshooting the desired program state.

Figure 6C:
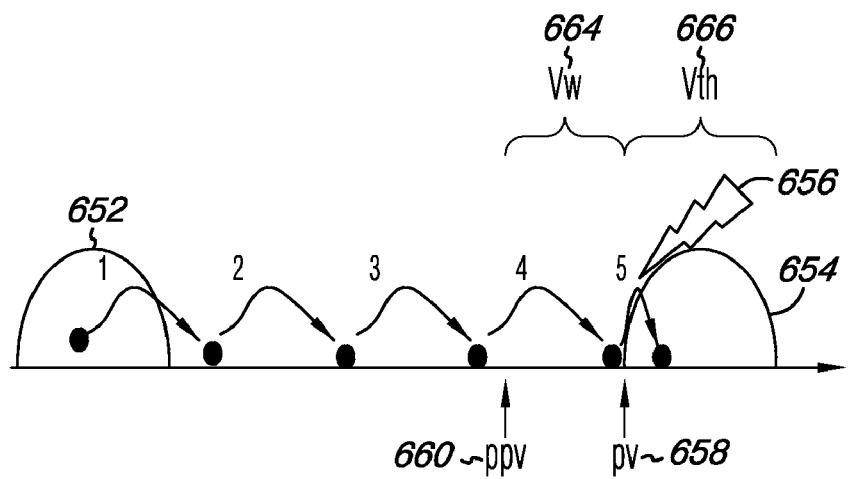
FIG. 6C is a graph showing a memory cell programmed voltage profiles with memory kink compensation according to one or more embodiments of the present disclosure.

FIGS. 6A-6C illustrate program states as corresponding to certain voltage range, shown graphically by an initial program state 652 and a desired program state 654 that are separated by some voltage therebetween along the horizontal voltage axis 650. In practice, a particular memory cell may be determined to be "in" a particular program state by measuring whether a threshold voltage of the memory cell is greater than or equal to a program verify voltage level associated with the particular program state. The upper voltage bound of the particular program state may be defined by a program verify voltage level of a higher program state. However, for purposes of this discussion, a program state will be referred to as corresponding to a voltage range having as its lower boundary the program verify level associated with that program state.

Applied programming pulses can move the programmed voltage, e.g., 653, of the particular memory cell being programmed from an initial program state 652, towards some higher program state. As one skilled in the art will now appreciate, the programmed voltage increases with each programming pulse due to the increase in programming pulse magnitude, e.g., by the programming step voltage, and by kink which may occur.

While movement of the programmed voltage is shown labeled 1, 2, 3, etc., which could correspond for example to programming pulses 1, 2, 3, etc. shown in FIG. 5A, initial programming pulses may not result in change in threshold voltage (Vt). Thus, the numerical labels shown in FIG. 6A-6C on the delta Vt changes (to the stored charge of the particular memory cell being programmed) are for ease of illustration and description herein only, and are not intended to represent correspondence with any particular programming pulse within a series of sequentially incrementing programming pulses.

As shown in FIG. 6A, the programmed voltage of the particular memory cell being programmed changes uniformly in response to programming pulses 1-3, as might be expected for sequentially incrementing programming pulses. However, programming pulse 4 is indicated to include some kink 656, which causes the delta Vt for programming pulse 4 to be larger than the delta Vt for the previous programming pulses, e.g., 1-3. However, the programmed voltage of the particular memory cell after programming pulse 3 is far enough away from the desired program state 654, that the larger delta Vt for programming pulse 4 changes the programmed voltage of the particular memory cell being programmed into the program state 654. Thus, the larger delta Vt due to kink is shown in FIG. 6A as having no detrimental effect on the programming operations of the particular memory cell being programmed.

FIG. 6A indicates two voltage levels of interest along axis 650, a program verify threshold 658 (PV) and a pre-program verify threshold 660 (PPV). While these voltage levels will be explained in further detail with respect to FIG. 6C, the reader should appreciate that the program verify threshold 658 (PV) indicates the lower boundary of the desired program state 654 in FIG. 6A.

FIG. 6B shows another possible programming scenario. The programmed voltage of the particular memory cell being programmed changes uniformly in response to programming pulses 1-4, as might be expected for sequentially incrementing programming pulses. Note programming pulse 4 is not indicated to include kink, as was the case shown in FIG. 6A. Instead, the programmed voltage of the particular memory cell being programmed after programming pulse 4 is just less than the desired program state 654. Programming pulse 5 is indicated to include some kink 656, which causes the delta Vt for programming pulse 5 to be larger than the delta Vt for the previous programming pulses, e.g., 1-4. In this instance, the larger delta Vt for programming pulse 5 moves the desired program state 654, resulting in an over-programmed condition. Thus, FIG. 6B shows that a larger delta Vt due to kink can have a detrimental effect on the programming operations of the particular memory cell being programmed.

FIG. 6B indicates the larger delta Vt due to kink has a maximum value of Vkmax, e.g., double-sided kink, as being greater than the range of voltages corresponding to desired program state 654. Because the maximum delta Vt due to kink is larger than the range of voltages corresponding to desired program state 654, the reader will appreciate that the larger delta Vt due to kink can move the programmed voltage of the particular memory cell from a voltage level initially less than the desired program state 654, e.g., the program verify voltage level 658, to a voltage greater than the desired program state 654.

FIG. 6C is a graph showing a memory cell programmed voltage profile with memory kink compensation according to one or more embodiments of the present disclosure. The programmed voltage of a particular memory cell being programmed changes uniformly in response to programming pulses 1-4, as might be expected for sequentially incrementing programming pulses. Similar to FIG. 6B, programming pulse 4 is not indicated to include kink, and the programmed voltage of the particular memory cell being programmed, after programming pulse 4, is just less than the desired program state 654. Programming pulse 5 is indicated to include some kink 656 in FIG. 6C. However, kink compensation is applied to programming pulse 5, as shown in FIG. 6C by the delta Vt change being small, results in a delta Vt that does not over-shoot the desired program state 654.

Observe that the programmed voltage of the particular memory cell after programming pulse 4, which is just less than the desired program state 654, is within a voltage range between PV 658 and PPV 660. That is, the threshold voltage (Vt) of the particular memory cell after programming pulse 4 is greater than (or equal to) the pre-program verify voltage level 660 (PPV) and less than the program verify voltage level 658 (PV). The range between PV and PPV is indicated as Vw 664, and the range corresponding to desired program state 654 is indicated by Vth 666.

By configuring Vw to be substantially equal to Vkmax minus Vth, one skilled in the art will understand that by applying kink compensation to programming pulses applied when the programmed voltage of the particular memory cell being programmed is within the range of voltages Vw, e.g., greater than pre-program verify voltage level 660 and less than program verify voltage level 658, that over-shoot due to kink can be reduced if not eliminated. Thus, the program verify threshold 658 (PV) can be determined from Vth and Vkmax for a particular memory configuration and selection of operating parameters (e.g. seeding voltage, etc.).

The delta Vt for pulse 5 is shown to be less than the Vt for a non-kink-compensated programming pulse in FIG. 6C; however, embodiments are not limited to this condition. For example, the delta Vt for a kink compensated programming pulse can be made to be the same delta Vt change as non-kink-corrected programming pulses. Assuming that the delta Vt for a non-kink-corrected programming pulse is less than the range of voltages corresponding to the desired program state 654, over-programming should not occur by applying kink compensation to programming pulses when the programmed voltage of the particular memory cell being programmed is within the range of voltages Vw 664, e.g., greater than PPV and less than PV.

Note that programming pulse 4 resulted in a programmed voltage just above PPV, and given the smaller delta Vt for programming pulse 5 shown in FIG. 6C, the programmed voltage of the particular memory cell after programming pulse 5 may have not made it within the desired program state 654, and another programming pulse with kink compensation may have been needed to move the programmed voltage into the desired program state 654.

Figure 7:
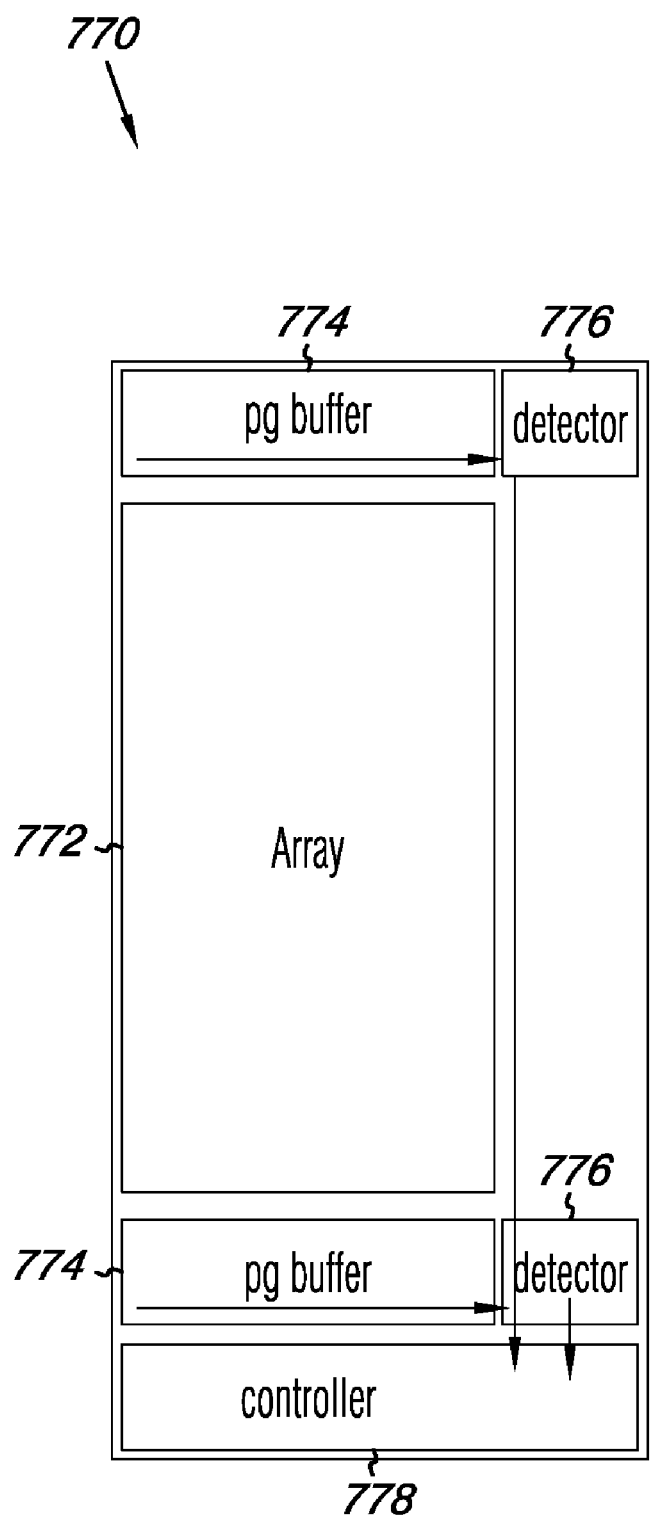
FIG. 7 is a functional block diagram of a memory operated in accordance with one or more embodiments of the present disclosure.

FIG. 7 is a functional block diagram of a memory 770 operated in accordance with one or more embodiments of the present disclosure. Memory 770 includes at least one memory array 772, and a number of page buffers 774 and corresponding detector 776 associated with each memory array 772. The a number of page buffers 774 and detectors 776 are communicatively coupled to the array 772 and control circuitry 778 (e.g., state machine, sequencer, controller). The at least one memory array 772 has a number of memory cells, which may be logically arranged into a number of columns.

According to one or more embodiments, the number of columns affected by kink can be determined after a programming pulse. For example, after each programming pulse, the number of columns affected by kink can be detected by the combination of the page buffer 774 and detector 776, and communicated to the controller 778. One such method for determining the number of columns which may be affected by kink (e.g., performing a "kink check") is set forth in commonly-assigned U.S. patent application Ser. No. 12/559,275, filed Sep. 14, 2009, entitled "Memory Kink Check." However, methods for determining the number of columns which may be affected by kink are not limited to those described therein, and other methods are contemplated for determining the number of memory cells, or the number of columns of memory cells that are affected by kink. The controller 778 may include hardware or software to implement error-correcting code (ECC), and thus be capable of correcting a particular number of errors caused by kink.

However, if the number of columns affected by kink (errors) is greater than (or equal to) a specific threshold, e.g., based on ECC capabilities, the controller can implement kink compensation, such as by adjusting program step magnitudes as has been previously described herein. Until the number of columns affected by kink (errors) is greater than (or equal to) the specific threshold, kink errors can be corrected by ECC means, for example. The specific number of columns can be based on a percentage of total columns, or some other decisioning methodology for triggering kink compensation.

Figure 8:
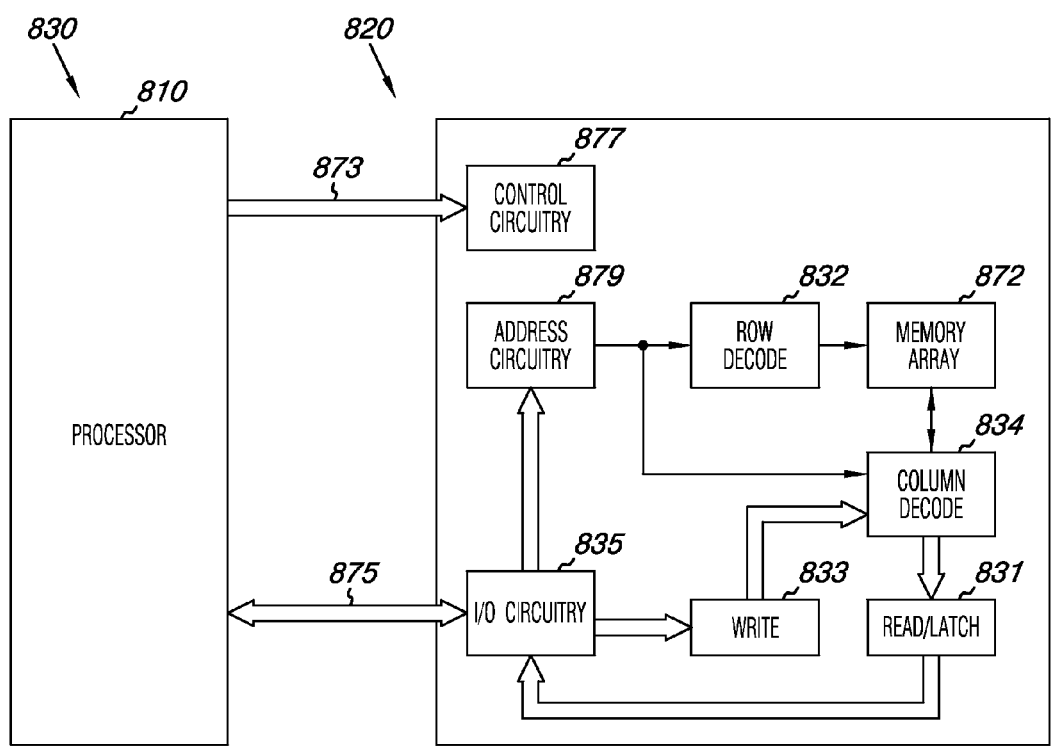
FIG. 8 is a functional block diagram of an electronic memory system having at least one memory device operated in accordance with one or more embodiments of the present disclosure.

FIG. 8 is a functional block diagram of an electronic memory system 830 having at least one memory device 820 operated in accordance with one or more embodiments of the present disclosure. Memory system 830 includes a processor 810 coupled to a non-volatile memory device 820 that includes a memory array 872 of non-volatile cells, e.g., memory array 100 of non-volatile cells 111-1, . . . , 111-N shown in FIG. 1. The memory system 830 can include separate integrated circuits or both the processor 810 and the memory device 820 can be on the same integrated circuit. The processor 810 can be a microprocessor or some other type of controlling circuitry such as an application-specific integrated circuit (ASIC).

The memory device 820 includes an array of non-volatile memory cells 872, which can be floating gate flash memory cells with a NAND architecture, as previously described herein. The embodiment of FIG. 8 includes address circuitry 879 to latch address signals provided over I/O connections 875 through I/O circuitry 835. Address signals are received and decoded by a row decoder 832 and a column decoder 834 to access the memory array 872. It will be appreciated by those skilled in the art that the number of address input connections depends on the density and architecture of the memory array 872 and that the number of addresses increases with both increased numbers of memory cells and increased numbers of memory blocks and arrays.

The memory device 820 senses data in the memory array 872 by sensing voltage and/or current changes in the memory array columns using sense/buffer circuitry that in this embodiment can be read/latch circuitry 831. The read/latch circuitry 831 can read and latch a page, e.g., a row, of data from the memory array 872. I/O circuitry 835 is included for bi-directional data communication over the I/O connections 875 with the processor 810. Write circuitry 833 is included to write data to the memory array 872.

Control circuitry 877 decodes signals provided by control connections 873 from the processor 810. These signals can include chip signals, write enable signals, and address latch signals that are used to control the operations on the memory array 872, including data sensing, data write, and data erase operations, as described herein. In one or more embodiments, the control circuitry 877 is responsible for executing instructions from the processor 810 to perform the operations according to embodiments of the present disclosure. It will be appreciated by those skilled in the art that additional circuitry and control signals can be provided, and that the memory device detail of FIG. 8 has been reduced to facilitate ease of illustration.

CONCLUSION

The present disclosure includes methods and devices for memory kink compensation. One method embodiment includes applying a number of sequentially incrementing programming pulses to a memory cell, with the sequential programming pulses incrementing by a first programming pulse step voltage magnitude. A seeding voltage is applied after applying the number of sequentially incrementing programming pulses. A next programming pulse is applied after applying the seeding voltage, with the next programming pulse being adjusted by a second programming pulse step voltage magnitude. The second programming pulse step voltage magnitude can be less than the first programming pulse step voltage magnitude.

Another method embodiment includes applying a number of programming pulses to the memory cell until the memory cell is programmed to a voltage greater than or equal to a pre-program verify voltage and less than a program verify voltage level. A programming pulse step voltage magnitude is adjusted for a next programming pulse to be applied to the memory cell.

Yet another method embodiment includes determining a number of memory cells affected by kink after application of a particular programming pulse. If the determined number is greater than or equal to a threshold number, for a next programming pulse after the particular programming pulse, a programming pulse step voltage magnitude is adjusted.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present.

As used herein, the term "and/or" includes any and all combinations of a number of of the associated listed items. As used herein the term "or," unless otherwise noted, means logically inclusive or. That is, "A or B" can include (only A), (only B), or (both A and B). In other words, "A or B" can mean "A and/or B" or "a number of of A and B."

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of the present application should be determined with reference to the appended claims; along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for kink compensation in a memory, comprising:
   applying sequentially incrementing programming pulses to a memory cell, wherein the sequential programming pulses each increment by a first programming pulse step voltage magnitude;
   applying a seeding voltage after applying the sequentially incrementing programming pulses, the seeding voltage being a negative starting voltage applied to the memory cell; and
   applying a next programming pulse after applying the seeding voltage, the next programming pulse being adjusted relative to a preceding one of the sequentially incrementing programming pulses by a second programming pulse step voltage magnitude,
   wherein the second programming pulse step voltage magnitude is less than the first programming pulse step voltage magnitude.

2. The method of claim 1, wherein the second programming pulse step voltage magnitude is zero.

3. The method of claim 1, wherein the second programming pulse step voltage magnitude is negative.

4. The method of claim 1, wherein applying the seeding voltage includes applying additional voltage to boost a channel voltage.

5. The method of claim 1, further including:
   adjusting the seeding voltage; and
   applying an adjusted programming pulse after adjusting the seeding voltage, the adjusted programming pulse being adjusted relative to the next programming pulse by a third programming pulse step voltage magnitude,
   wherein the third programming pulse step voltage magnitude is different than the second programming pulse step voltage magnitude.

6. The method of claim 1, further including:
   applying a programming pulse subsequent to applying the next programming pulse wherein the programming pulse applied subsequent to the application of the next programming pulse is adjusted relative to the next programming pulse by the first programming pulse step voltage magnitude.

7. The method of claim 1, wherein the second programming pulse step voltage magnitude is substantially equal to the magnitude of the first programming pulse voltage step less the seeding voltage.

8. The method of claim 1, wherein the second programming pulse step voltage magnitude is substantially equal to or greater than the first programming pulse step voltage magnitude less the effect to the memory cell being programmed due to double-sided kink from seeding an inhibit voltage of adjacent memory cells not being programmed.

9. The method of claim 1, wherein the second programming pulse step voltage magnitude is substantially equal to the first programming pulse step voltage magnitude less the effect to the memory cell being programmed due to single-sided kink from seeding an inhibit voltage of an adjacent memory cell not being programmed.

10. The method of claim 1, wherein the second programming pulse step voltage magnitude is:
    less than the first programming pulse step voltage magnitude less the effect to the memory cell being programmed due to double-sided kink from seeding an inhibit voltage of adjacent memory cells not being programmed, and
    greater than the first programming pulse step voltage magnitude less the effect to the memory cell being programmed due to single-sided kink from seeding an inhibit voltage of an adjacent memory cell not being programmed.

11. A memory device with kink compensation, comprising:
- an array of memory cells; and
- a control circuitry coupled to the array of memory cells configured to:
  - apply sequentially incrementing programming pulses to a memory cell, wherein the sequential programming pulses each increment by a first programming pulse step voltage magnitude;
  - apply a seeding voltage after applying the sequentially incrementing programming pulses, the seeding voltage being a negative starting voltage applied to the memory cell; and
  - apply a next programming pulse after applying the seeding voltage, the next programming pulse being adjusted relative to a preceding one of the sequentially incrementing programming pulses by a second programming pulse step voltage magnitude,
  - wherein the second programming pulse step voltage magnitude is less than the first programming pulse step voltage magnitude.

12. The memory device of claim 11, wherein the control circuitry is further configured to apply the next programming pulse immediately after applying the seeding voltage.

13. A method for kink compensation in a memory, comprising:
- applying sequentially incrementing programming pulses to a memory cell, wherein the sequential programming pulses each increment by a first programming pulse step voltage magnitude;
- applying a seeding voltage after applying the sequentially incrementing programming pulses; and
- applying a next programming pulse after applying the seeding voltage, the next programming pulse being adjusted relative to a preceding one of the sequentially incrementing programming pulses by a second programming pulse step voltage magnitude,
- wherein the second programming pulse step voltage magnitude is less than the first programming pulse step voltage magnitude, and
- wherein the second programming pulse step voltage magnitude is one of zero or negative.

14. A method for kink compensation in a memory, comprising:
- applying sequentially incrementing programming pulses to a memory cell, wherein the sequential programming pulses each increment by a first programming pulse step voltage magnitude;
- applying a seeding voltage after applying the sequentially incrementing programming pulses; and
- applying a next programming pulse after applying the seeding voltage, the next programming pulse being adjusted relative to a preceding one of the sequentially incrementing programming pulses by a second programming pulse step voltage magnitude,
- wherein the second programming pulse step voltage magnitude is less than the first programming pulse step voltage magnitude, and
- wherein applying the seeding voltage includes applying additional voltage to boost a channel voltage.

15. A method for kink compensation in a memory, comprising:
- applying sequentially incrementing programming pulses to a memory cell, wherein the sequential programming pulses each increment by a first programming pulse step voltage magnitude;
- applying a seeding voltage after applying the sequentially incrementing programming pulses; and
- applying a next programming pulse after applying the seeding voltage, the next programming pulse being adjusted relative to a preceding one of the sequentially incrementing programming pulses by a second programming pulse step voltage magnitude,
- wherein the second programming pulse step voltage magnitude is less than the first programming pulse step voltage magnitude, and
- wherein the second programming pulse step voltage magnitude is one of:
- substantially equal to the magnitude of the first programming pulse voltage step less the seeding voltage;
- substantially equal to or greater than the first programming pulse step voltage magnitude less the effect to the memory cell being programmed due to double-sided kink from seeding an inhibit voltage of adjacent memory cells not being programmed;
- substantially equal to the first programming pulse step voltage magnitude less the effect to the memory cell being programmed due to single-sided kink from seeding an inhibit voltage of an adjacent memory cell not being programmed; and
- less than the first programming pulse step voltage magnitude less the effect to the memory cell being programmed due to double-sided kink from seeding an inhibit voltage of adjacent memory cells not being programmed, and greater than the first programming pulse step voltage magnitude less the effect to the memory cell being programmed due to single-sided kink from seeding an inhibit voltage of an adjacent memory cell not being programmed.

* * * * *